(12) United States Patent
Wahlberg

(10) Patent No.: US 6,452,522 B1
(45) Date of Patent: Sep. 17, 2002

(54) DELTA MODULATOR

(75) Inventor: Stefan Wahlberg, Haninge (SE)

(73) Assignee: Pacesetter AB, Järfälla (SE)

( * ) Notice: Subject to any disclaimer, the term of this patent is extended or adjusted under 35 U.S.C. 154(b) by 0 days.

(21) Appl. No.: 09/403,841

(22) PCT Filed: Apr. 17, 1998

(86) PCT No.: PCT/SE98/00702

§ 371 (c)(1),
(2), (4) Date: Oct. 25, 1999

(87) PCT Pub. No.: WO98/49777

PCT Pub. Date: Nov. 5, 1998

(30) Foreign Application Priority Data

Apr. 29, 1997 (SE) .................................. 9701604

(51) Int. Cl.7 ................................................ H03M 3/00
(52) U.S. Cl. ....................................... 341/143; 341/120
(58) Field of Search ............................... 341/143, 120; 332/11; 307/246, 261, 362, 228

(56) References Cited

U.S. PATENT DOCUMENTS

| | | | | |
|---|---|---|---|---|
| 3,761,841 A | * | 9/1973 | Jacquart ....................... | 332/11 |
| 4,527,133 A | * | 7/1985 | Money ......................... | 332/11 |
| 4,943,807 A | | 7/1990 | Early et al. | |
| 4,951,052 A | | 8/1990 | Jacob et al. | |
| 4,999,625 A | * | 3/1991 | Thompson ................... | 341/118 |
| 5,028,924 A | * | 7/1991 | Thompson ................... | 341/118 |
| 5,140,595 A | * | 8/1992 | Geldman et al. ........... | 371/39.1 |
| 5,257,026 A | | 10/1993 | Thompson et al. | |
| 5,977,896 A | * | 11/1999 | Kohdaka et al. ............ | 341/143 |
| 6,225,928 B1 | * | 4/2001 | Green ......................... | 341/143 |

* cited by examiner

*Primary Examiner*—Peguy JeanPierre
*Assistant Examiner*—Joseph Lauture
(74) *Attorney, Agent, or Firm*—Schiff Hardin & Waite

(57) ABSTRACT

An adaptive delta modulator has an A/D-converter controlled by a digital control signal, which is also supplied to a drift compensation logic circuit, which generates a drift compensated digital output signal by an appropriate shift operation of the applied control signal, dependent on an initially detected shift in the A/D converter.

9 Claims, 3 Drawing Sheets

DELTA MODULATOR

BACKGROUND OF THE INVENTION

1. Field of the Invention

The present invention is directed to an adaptive delta modulator of the type having an analog-to-digital converter (AND-converter) controlled by a digital control signal.

2. Description of the Prior Art

Basically, delta modulation is a simple method of converting analog signals into digital signals. A basic delta modulator (see FIG. 1A) consists of a comparator and a sampler in a direct path and an integrator-amplifier in a feedback path. The analog input signal m(t) is compared with the feedback signal m̂(t). If there is an error signal $\epsilon(t) = \hat{m}(t) - m(t)$ this is applied to a comparator. If $\epsilon$ is positive, the comparator output is a constant signal of amplitude E, and if $\epsilon$ is negative, the comparator output is –E. Thus the comparator output $m_c(t)$ is given by $m_c(t) = E$ sign $\epsilon(t)$. The comparator output is sampled by a sampler at a rate of $f_s$ samples/second where $f_s$ is typically much higher than the Nyquist rate. The sampler thus produces a pulse train d(t) which consists of positive pulses when m̂(t)>m(t) and negative pulses when m̂(t)<m(t). The pulse train d(t) is the delta modulated pulse train. The modulated signal d(t) is amplified and integrated in the feedback path to generate m̂(t) (FIG. 1B), which is to follow m(t). Each pulse in d(t) (FIG. 1C) gives rise to a step function (positive or negative depending on the pulse polarity) in m̂(t). The use of only one step size in the above described delta modulator limits the possibilities to follow input signals having rapid changes. If, however, the input signal has small changes a relatively large step size would make the corresponding digital output signal too erratic. A solution to this problem is accomplished by increasing or decreasing the step sizes used by the delta modulator. This well known device is called an adaptive delta modulator.

In U.S. Pat. No. 4,527,133 a delta modulator is described. One problem that the device of U.S. Pat. No. 4,527,133 is directed to solve is the problem emanating from that the two current sources are not perfectly matched. That means that one of the current sources will have to to be connected to the input capacitor more often than the other in order to control the same total voltage change across the capacitor albeit in opposite directions). According to U.S. Pat. No. 4,527,133 this problem is solved by arranging an additional capacitor to which periodically both current sources are connected simultaneously. The voltage across this capacitor is a function of the mismatch in the two current source amplitudes. The voltage across the capacitor is used to control the amplitude of at least one of the two current sources. Thus, the drift compensation is made by arranging extra hardware. It is an overall ambition in the field of implantable medical devices, such as implantable heart stimulators or defibrillators, to minimize the volume and weight and to minimize the energy consumption of the components used in such devices. For that reason the solution of the problem of drift compensation of the current sources used in U.S. Pat. No. 4,527,133 suffers from the drawback of comprising extra hardware rendering the device to voluminous and heavy and energy consuming and thus not suitable for use in modern implantable devices. A light and less energy consuming delta modulator according to the invention can, of course, be used in any technical field. In practice one way of realizing a delta modulator is principally by arranging a capacitor that is charged by one current source and discharged by another current source so that the potential of the capacitor tracks the analog input signal. In the case of an adaptive delta modulator a predetermined number of current generators are arranged for charging and discharging wherein each current generator generates a predetermined unique current.

SUMMARY OF THE INVENTION

It is an object of the present invention to provide an adaptive delta modulator wherein the above-described drift compensation problem is solved.

This object is achieved in accordance with the principles of the present invention in an adaptive delta modulator having an A/D-converter controlled by a digital control signal, the digital control signal also being supplied to a drift compensation logic circuit which generates a drift compensated digital output signal by manipulation of the control signal, in order to produce an output signal of the delta modulator.

DESCRIPTION OF THE PREFERRED EMBODIMENTS

Figure 1A:
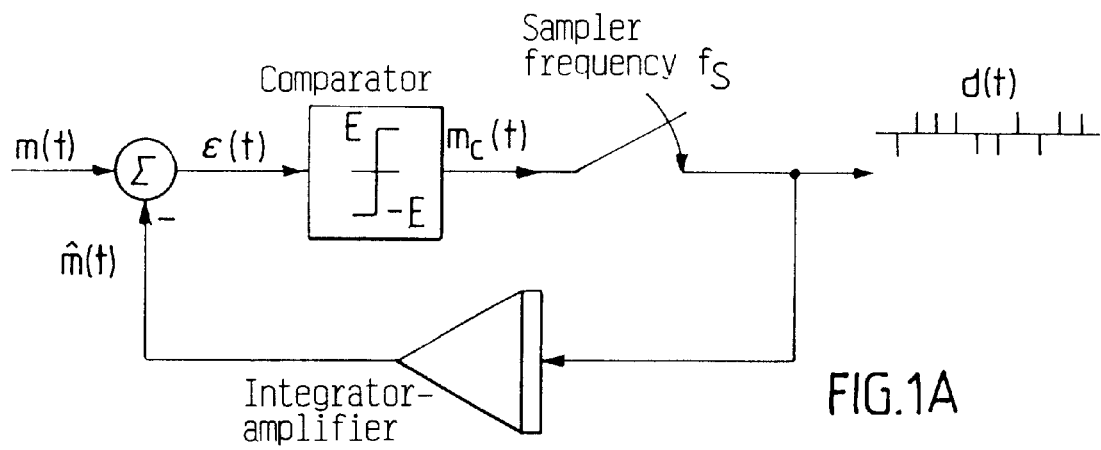
FIGS. 1A, 1B and 1C, as explained above, respectively show a block diagram and graphs illustrating the working principles of a basic prior art delta modulator.
Figure 1B:
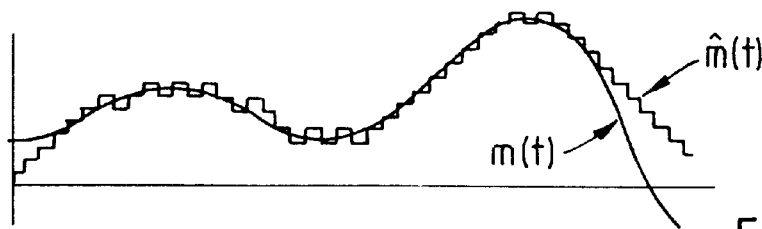
Figure 1C:
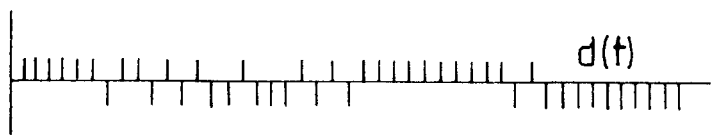
Figure 2:
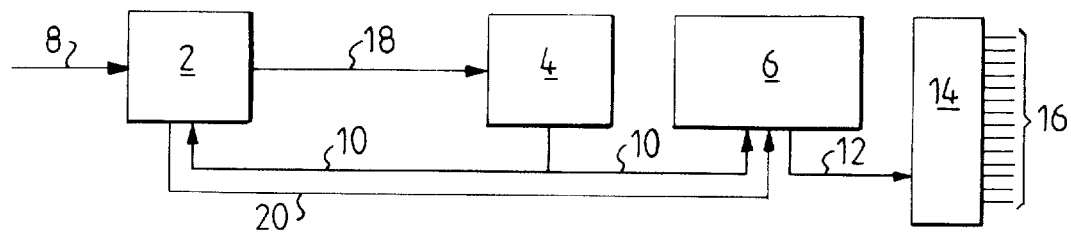
FIG. 2 shows a block diagram of an adaptive delta modulator according to the invention.

FIG. 2 shows a block diagram of an adaptive delta modulator according to the invention having an analog to digital converter (A/D-converter) 2, a level control logic circuit 4 and drift compensation logic means 6. An analog input signal 8 is supplied to he A/D-converter 2, the A/D-converter 2 being controlled by a control signal 10 generated by the level control logic circuit 4. The control signal contains sign bit and a control word (W) having C control bits, each control bit corresponds to a specific current generator in the current source (this will be described in detail below). The control signal 10 is also supplied to the drift compensation logic means 6 which generates a drift compensated digital output signal 12. The signal 12 is supplied to an adder 14 for generation of a digitally recreated signal 16. A present sign bit signal 18 is generated by the A/D-converter 2 and supplied to the control logic circuit 4. FIG. 2 also shows a level crossing signal 20 which is used in one of the preferred embodiments described in greater detail below. This level crossing signal is generated by the A/D-converter and supplied to the drift compensation logic circuit 6.

Figure 3:
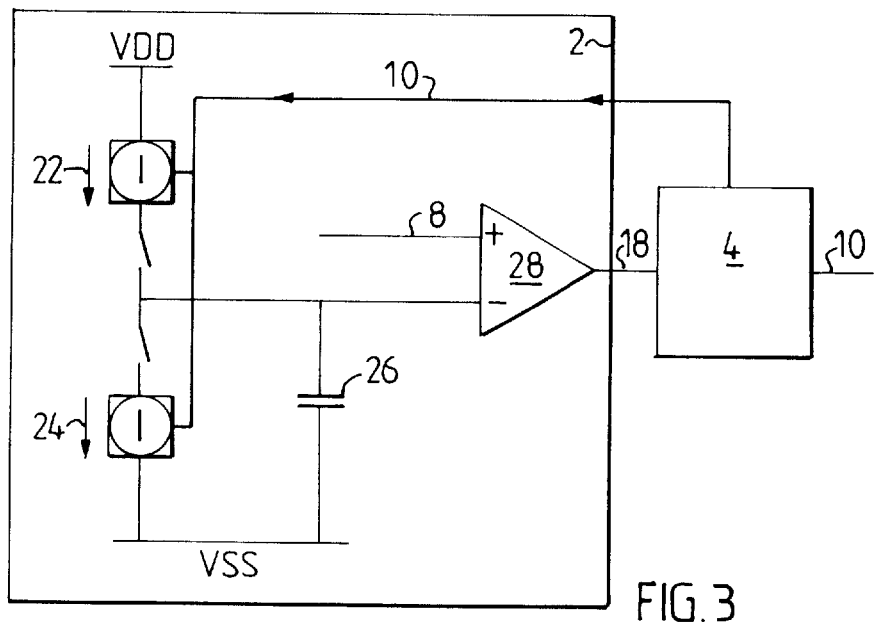
FIG. 3 shows the A/D-converter and the level control logic circuit according to the invention in greater detail.

In FIG. 3 the A/D-converter 2 and the level control logic circuit 4 are shown in greater detail. The A/D-converter has two current sources 22,24 each containing a predetermined number of current generators, a capacitor 26 and comparator 28 adapted to generate the present sign bit signal (1 or 0) at the end of each sample interval to the level control logic circuit 4. The current sources 22,24 are coupled between energizing potentials VDD and VSS.

The analog input signal 8 is applied to the comparator 28 where the signal is compared to the present potential of the capacitor 26. If the input signal 8 is greater than the present potential of the capacitor 26 the comparator 28 generates a "1" to the level control logic circuit 4, and if the input signal 8 is less than the present potential of the capacitor 26 it generates a "0" to the level control logic circuit 4.

Figure 4:
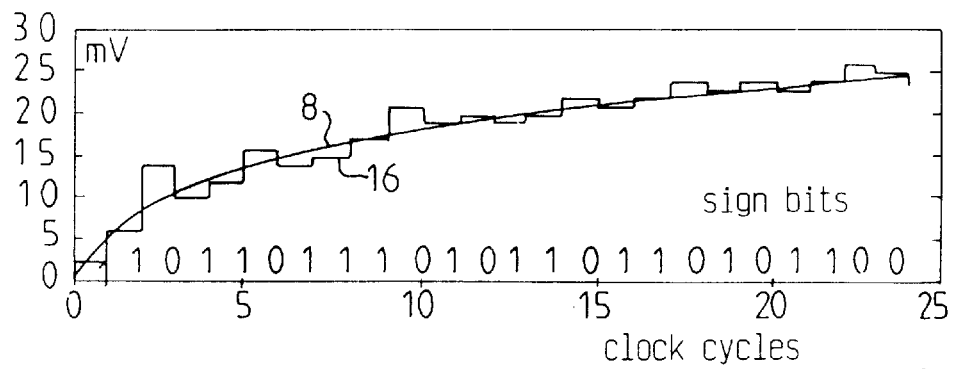
FIG. 4 shows a diagram with the analog input signal and a corresponding digitally recreated signal.
Figure 5:
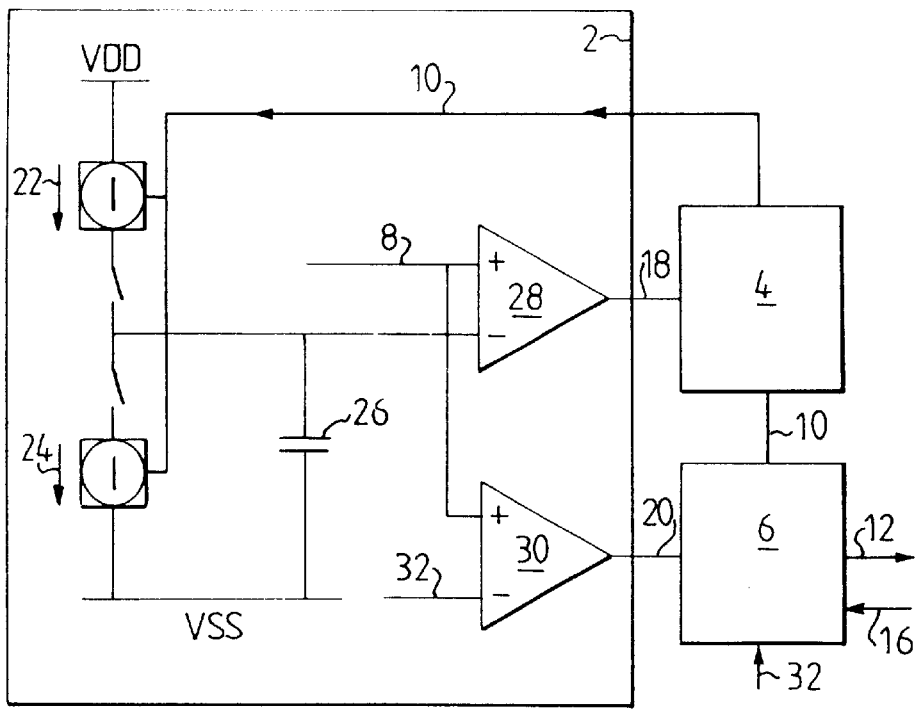
FIG. 5 shows a preferred embodiment of the A/D-converter and the level control logic circuit according to the invention in greater detail.

FIG. 4 shows a diagram with the analog input signal S and the corresponding digitally recreated signal 16. In the figure the X-axis indicates clock cycles and the y-axis stream is shown to illustrate how the sign bit influences the digitally recreated signal 16. The sampling frequency is of course dependent on the frequency of the analog input signal, generally the higher sampling frequency the better tracking of the analog signal by the digital output signal. Using the adaptive delta modulator according to the invention for A/D-conversion of an intracardic electrogram (IEM.) signal it has been shown that a sampling frequency oaf 16 kHz gives less noise and good tracking of the analog signal. As indicated above each current sources means 32,24 contains a predetermined number C of current generators, and according to a preferred embodiment each current source comprises 8 current generators. The control signal 10 controlling the charging and discharging of the capacitor 26 by use of the current sources 22,24 includes a C-bits control word (in the preferred embodiment an 8-bits) and one sign bit applied to the current source means. The number of bits in the control word equals the number of current generators in one current source and each bit-position in the control word represents a specific current generator. Each current generator in one current source generates a unique current for charging or discharging the 26 means so that different step sizes of the potential changes of the capacitor means can be achieved. According to the preferred embodiment only one of the current generators is active at one and the same time. The smallest step size is generated by the current generator represented by the least significant bit of the control word and the largest step size is represented by the most significant bit. According to the preferred embodiment the smallest stepsize is a potential difference of 15:6 $\mu$V and the largest is 2 mV. The differences between different steps can be exponential but other dependencies is also possible, e.g. the step sizes could grow by making the next step size twice the previous. The sign bit decides which current source is to be used. A "1" means the charging current source and a "0" means the discharging current source. In the preferred embodiment only one bit of the 8 bits of the control word is a "1". In the level control logic circuit 4 the previous sign bit and the present sign bit are compared, if they are equal the step size is made larger and if not equal the step size is made smaller by making an appropiate shift of the control word. This is valid both for charging and discharging. The present sign bit and the new control word is then applied to the current source and to the drift compensation logic circuit 6.

The drift compensation problem that occures when an adaptive delta modulator as previously described is used is that the two current source means is not matched, due to inaccuracies in the production. It can differ as much as 20% between a charging and a discharging that should have been equal. This will result in a drift in the system using the -delta modulator and in that the digitally recreated signal becomes outside of the dynamic of the system. To illustrate the phenomena it is assumed that the current generator in the current source used to charge the capacitor 26 has a smaller step size than the corresponding current generator in the current source used to discharge the capacitor 26. It is further assumed that the analog input signal is repetitive and having an arithmetical mean value that equals zero. To be able to track the signal the modulator must charge the capacitor 26 more often than it must discharge it. The digital output signal, contains the sign bit and the C-bits control word, then includes information saying that the analog signal is growing, due to the exessive number of sign bits and control words indicative of charging the capacitor 6. Thus, erroneously, the (not compensated) digital output signal indicates a positively drifting input signal, which was not the case.

To be able to compensate for the drift in the system the delta modulator initially is used with no drift compensation in order to detect if the drift is positive or negative. That is accomplished in the drift compensation logic circuit 6 by comparing the analog input signal 8 and the re-created signal 16 with each other. If the analog input signal 8 is greater than the re-created signal 6 the drift is positive and vice versa. The comparator circuits in the drift compensation logic circuit 6 as well as the signals to be compared are not shown in the figures. When the kind of drift is detected it is initialized in the level control logic circuit 4, this setting is permanent for the life time of the delta modulator. The compensation is made by manipulation of the new control word that is applied to the drift compensation logic circuit 6. If the drift is detected initially as positive the control word is manipulated by the drift compensation logic circuit 6 by an appropriate shift operation so that it is made smaller, i.e. if the sign bit is "1" the control word is shifted one step to the right and if the sign bit is "0" the control word is shifted one step to the left. If, however, the drift initially is detected as negative the control word is manipulated by an appropriate shift operation so that it is made greater, i.e. if the sign bit is "1" the control word is shifted one step to the left and if the sign bit is "0" the control word is shifted one step to the right. In the case that the control word is 0000 0001 and the appropriate shift operation is one shift to the right the control word remains 0000 0001, and in the case of the control word being 1000 0000 and the appropriate shift operation is one shift to the left the control word remains 1000 0000. The manipulated row of control words and sign bits, now referred to as the drift compensated digital output signal 12, is then applied to the addition means 14 to form the digitally recreated signal 16. Since it is not always considered necessary to do the above described drift compensation for every control word a compensation factor K is used indicating how often the drift compensation must be made. Drift compensation is made every K:th control word. If, for example, K=1 drift compensation is made for every control word or if K=20 drift compensation is made for every 20:th control word. Initially the compensation factor K is large (small compensation). According to one embodiment the compensation factor K is gradually lowered until the drift is minimized and then permanently set to that value. According to a preferred embodiment the compensation factor K instead is dynamically changed. This is achieved in the preferred embodiment by arranging a level crossing detection means 30 in the A/D-converter 2 arranged for generating the level crossing signal 20 when the analog input signal 8 crosses a preset level 32, this level preferably being zero. When a level crossing signal 0 is generated the digitally recreated signal 16 valid at that time is compared, in the drift compensation logic circuit 6, to the preset level 32, e.g. zero, and the compensation factor K is changed in dependence of said comparison. That is made according to the following principles: If the drift initially is set to positive and the digitally recreated signal lies below said; preset level the compensation factor K is made larger (less frequent compensation) since too much compensation is presently being made. If the digitally recreated signal lies above the preset level the compensation factor is made smaller (more frequent compensation).

If the drift, however, intially is set to negative and the digitally recreated signal lies below the preset level the compensation factor K is made smaller (more frequent compensation) since too little compensation is presently being made. If the digitally recreated signal lies above the preset level the compensation factor is made larger (less frequent compensation). If the compensation factor K is in the range of less than 30 it is preferably changed by one step each time. Tf it is greater than 30 it is possible to change the compensation factor by several steps each time.

To avoid changing the compensation factor K too often, in case of an input signal crossing said preset level very often a predetermined number of samples must pass before a change of the compensation factor K is possible. This predetermined number of samples is preferably in the range of 10–30. To further minimize the error in the system the recreated signal, at each generated level crossing signal, is set, in the adder means 14, to the preset level value 32. Although modifications and changes may be suggested by those skilled in the art, it is the intention of the inventor to embody within the patent warranted hereon all changes and modifications as reasonably and properly come within the scope of his contribution to the art.

I claim:

1. An adaptive delta modulator comprising:
    an A/D-converter having a signal input adapted to receive an analog input signal, and having a control input supplied with a digital control signal, said AID converter converting said analog input signal into a digital output signal in a conversion procedure dependent on said control signal;
    a control unit which generates said digital control signal supplied to said control input of said A/D-converter, said control signal comprising a sign bit and a control word having a plurality of control bits; and
    a drift compensation logic circuit also supplied with said control signal which detects an initial drift in said A/D converter and which manipulates said control signal dependent on said initially detected drift to generate a drift compensated digital output signal by shifting said bits of said control word dependent on said initially detected drift, by shifting said sign bit and said control word in a direction to make said sign bit and said control word smaller if said initially detected drift is positive, and by shifting said sign bit and said control word in a direction to make said sign bit and control bit larger if said drift is negative.

2. An adaptive delta modulator as claimed in claim 1 wherein said drift compensation logic circuit, if said initially detected drift is positive, shifts said control word and said sign bit by one bit to the right.

3. An adaptive delta modulator as claimed in claim 1 wherein said drift compensation logic circuit, if said initially detected drift is negative, shifts said control word and said sign bit by one bit to the left.

4. An adaptive delta modulator as claimed in claim 1 wherein said drift compensation logic circuit shifts every $K^{th}$ control word generated by said control unit, wherein K is a compensation factor which is greater than or equal to 1.

5. An adaptive delta modulator as claimed in claim 4 wherein said drift compensation logic circuit detects a present drift in said A/D-converter and wherein said drift compensation logic dynamically changes said compensation factor K dependent on said present drift.

6. An adaptive delta modulator as claimed in claim 5 wherein said A/D-converter comprises a level crossing detector having a preset level and which generates a level crossing signal when an analog input signal to said A/D-converter crosses said preset level, said level crossing signal being supplied to said drift compensation logic circuit and said drift compensation logic circuit detecting said present drift dependent on a level of a digitally recreated signal, produced from said compensated digital output signal, when said level crossing signal is generated.

7. An adaptive delta modulator comprising:
    an A/D-converter having a signal input adapted to receive an analog input signal, and having a control input supplied with a digital control signal, said A/D converter converting said analog input signal into a digital output signal in a conversion procedure dependent on said control signal;
    a control unit which generates said digital control signal supplied to said control input of said A/D-converter, said control signal comprising a sign bit and a control word having a plurality of control bits; and
    a drift compensation logic circuit also supplied with said control signal which detects an initial drift in said A/D-converter and which manipulates said control signal dependent on said initially detected drift to generate a drift compensated digital output signal by shifting the bits of every $K^{th}$ control word generated by said control unit, wherein K is a compensation factor which is greater than or equal to 1.

8. An adaptive delta modulator as claimed in claim 7 wherein said drift compensation logic circuit detects a present drift in said A/D-converter and wherein said drift compensation logic dynamically changes said compensation factor K dependent on said present drift.

9. An adaptive delta modulator as claimed in claim 8 wherein said A/D-converter comprises a level crossing detector having a preset level and which generates a level crossing signal when an analog input signal to said A/D-converter crosses said preset level, said level crossing signal being supplied to said drift compensation logic circuit and said drift compensation logic circuit detecting said present drift dependent on a level of a digitally recreated signal, produced from said compensated digital output signal, when said level crossing signal is generated.

* * * * *